United States Patent [19]
Yokoyama

[11] Patent Number: 5,459,734
[45] Date of Patent: Oct. 17, 1995

[54] TEST CIRCUIT FOR SIGNAL INPUT CIRCUIT HAVING THRESHOLD

[75] Inventor: Masahiro Yokoyama, Itami, Japan

[73] Assignee: Mitsubishi Denki Kabushiki Kaisha, Tokyo, Japan

[21] Appl. No.: 118,813

[22] Filed: Sep. 10, 1993

[30] Foreign Application Priority Data

Oct. 20, 1992 [JP] Japan ................................... 4-281671

[51] Int. Cl.⁶ ................................................ G01R 19/00
[52] U.S. Cl. ...................... 371/22.1; 371/21.1; 371/22.5; 371/21.4; 340/577
[58] Field of Search ................................ 371/21.4, 22.5; 340/577; 371/21.1, 22.1

[56] References Cited

U.S. PATENT DOCUMENTS

| | | | |
|---|---|---|---|
| 3,665,461 | 5/1972 | Gnagi et al. | 340/577 X |
| 4,855,669 | 8/1989 | Mahoney | 324/73 R |
| 4,922,184 | 5/1990 | Rosenstein et al. | 324/72.5 OR |

FOREIGN PATENT DOCUMENTS

| | | |
|---|---|---|
| 3028871 | 3/1982 | Germany. |
| 3709032C2 | 9/1987 | Germany. |
| 4038535A1 | 6/1992 | Germany. |

Primary Examiner—Edward R. Cosimano
Assistant Examiner—Kamini Shah
Attorney, Agent, or Firm—Lowe, Price, LeBlanc & Becker

[57] ABSTRACT

A test circuit for testing a signal input circuit having a threshold, an operational amplifier 3, for example, which converts voltages of input signal into a binary signal and supplies it to a logic circuit, a register 8, for example, is provided with signal lines 91, 92 connecting an input end and an output end of the register 8 through a switch 9. The test circuit judges a threshold of the operational amplifier 3 on the basis of voltage of a signal inputted to the operational amplifier 3 and a value of an output signal outputted from the operational amplifier 3 through the signal line 91, the switch 9, and the signal line 92 by turning switch 9 on. It is possible to perform testing at high speed without software processing. It is also possible to make the occupied area on one chip small when a plurality of signal input circuits are provided on the chip.

10 Claims, 7 Drawing Sheets

5,459,734

TEST CIRCUIT FOR SIGNAL INPUT CIRCUIT HAVING THRESHOLD

BACKGROUND OF THE INVENTION

1. Field of the Invention

The present invention relates to a test circuit for judging a threshold of a signal input circuit which inputs an analog or digital signal to converts it to a binary signal at a predetermined threshold. The binary signal is supplied to various logic circuits, such as registers, microcomputers, and the like.

2. Description of Related Art

FIG. 1 is a block diagram showing a configuration example of a test circuit of a conventional signal input circuit (hereinafter, to be called an input threshold circuit) having a threshold. In this conventional example, a circuit testing a threshold of an operational amplifier as the input threshold circuit, to which am analog signal is inputted, is shown as an example.

In FIG. 1, reference numeral 1 designates an analog input terminal, 2 a reference voltage input terminal, 3 an operational amplifier as the input threshold circuit, 4 an operational amplifier output signal, 5 a sampling clock, 6 a sampling circuit, 7 an output signal (hereinafter, to be called a sampling output) of the sampling circuit 6, 8 a register as a logic circuit, 10 an output dedicated line, 12 an output circuit, and 13 designates a judging terminal.

Next, explanation will be given on the operation.

In the circuit shown in FIG. 1, a certain constant voltage, 1 V, for example, is inputted as a threshold to the reference voltage input terminal 2, and voltage more than the reference voltage, 1.5 V, for example is inputted to the analog input terminal 1. Thereby, the operational amplifier 3 operates responsive to voltages of the input signals form the two input terminals and outputs "1" as the output signal On the contrary, when voltage less than the reference voltage, 0.5 V, for example is inputted to the analog input terminal 1, the operational amplifier 3 outputs "0" as the output signal 4.

By the fact that the sampling circuit 6 takes in the output signal 4 of the operational amplifier 3 in synchronism with the sampling clock 5, the sampling output 7 is obtained. The sampling clock 5 is supplied from the outside, or the internal system clock or the frequency dividing clock thereof is used as the sampling clock.

Next, the sampling output 7 is temporarily stored in the register 8 with software processing, then outputted to the output dedicated line 10 with software processing. Since the output signal from the register 8 is outputted to the judging terminal 13 through the output circuit 12, when the voltage of the analog signal inputted to the analog input terminal 1 of the operational amplifier 3 is changed step by step, the actual threshold of the operational amplifier 3 becomes clear by reading the value of the output signal. In such a way, by the circuit shown in FIG. 1, it is possible to test whether or not the operational amplifier 3 is operated normally.

By the way, since the conventional test circuit for the signal input circuit having a threshold shown in FIG. 1 performs inputting of the sampling output 7 to the register 8 and outputting thereof from the register 8 with the software, time is required for the setting, therefore testing efficiency is low. Especially, in the example shown in FIG. 1, since the output signal of the operational amplifier 3 is outputted to the output circuit 12 after it is temporarily stored in the register 8, the value of the output signal of the operational amplifier 3 is outputted intact to the output circuit 12, but in the case where a microcomputer, for example, is connected as a logic circuit instead of the register 8, a testing program for adjusting the relationship between the value of the output signal of the operational amplifier 3 and the value of the signal outputted to the output circuit 12 is required.

Recently, to say nothing of a microcomputer, the voltage used in the other kinds of logic circuits has been made low. Accordingly, improvement of test accuracy of the signal input circuit for inputting signal to various kind of logic circuits, including a microcomputer, is desired. This is because there is a necessity to test a threshold of the signal input circuit more accurately compared with the conventional one, since a difference between the maximum voltage of signal inputted to the signal input circuit and the minimum voltage thereof becomes smaller as the voltage of the logic circuit is made lower.

Moreover, conventionally, a test circuit such as mentioned above is required for various kind of respective logic circuits of an integrated circuit configured on one chip. Therefore, when test circuit such as mentioned above are provided for the various kinds of respective logic circuits of the integrated circuit, the test circuits occupy a large area on a chip, causing a bad effect upon mounting efficiency.

SUMMARY OF THE INVENTION

The present invention has been devised in consideration of such circumstances, and the object thereof is to provide a test circuit capable of performing a test of a threshold of the signal input circuit having a threshold without requiring a software processing at high speed, and capable of making the occupied area of test circuits on one chip small, even when a plurality of signal input circuits are provided on one chip.

A first invention of the test circuit for a signal input circuit having a threshold of the invention is a test circuit for the signal input circuit which converts voltages of input signals into a binary signal by a predetermined threshold and supplies it to a logic circuit, and the test circuit is provided with short circuit means connecting an input end and an output end of the logic circuit through a switch, and is configured so that it judges a threshold of the signal input circuit on the basis of voltage inputted to the signal input circuit and a value of output signal outputted form the signal input circuit through the short circuit means by making the switch to be one on-state.

A second invention of the test circuit for a signal input circuit having a threshold of the invention is a test circuit for a plurality of signal input circuits, each of which converts voltages of input signals into a binary signal by a predetermined threshold and supplies it to the plurality of logic circuits respectively, and the test circuit is provided with a plurality of short circuit means connecting an input end and an output end of each logic circuit through a switch and with an OR gate to whose input end and output end of each logic circuit is connected, and is configured so that it judges a threshold of each signal input circuit on the basis of voltage of signal inputted to each signal input circuit and a value of output signal outputted from any one of a plurality of signal input circuits through each short circuit means and OR gate by making each switch to be on-state.

A third invention of the test circuit for a signal input circuit having a threshold of the invention is a test circuit for a plurality of signal input circuits each of which converts voltages of inputted signals into a binary signal by a predetermined threshold and supplies it to a logic circuit, and the test circuit is provided with a short circuit means connecting an input end and an output end of a logic circuit through a switch, and with an OR gate to whose input end and output end of each signal input circuit is connected, and is configured so that it judges a threshold of each signal input circuit on the bases of voltage of signal inputted to each signal input circuit and a value of output signal outputted from any one of a plurality of signal input, circuits through the OR gate and the short circuit means by making each switch to be on-state.

According to the first invention of the test circuit for the signal input circuit having a threshold, since a portion between the input end and the output end of the logic circuit is short-circuited by the short circuit means, an output signal from the signal input circuit is outputted intact through the short circuit means by making a switch to be on-state. A threshold of the signal input, circuit is judged on the bases of a value of signal outputted from the short circuit means and voltage of signal inputted to the signal input circuit.

According to the second invention of the test circuit For the signal input circuit having a threshold, since a portion between the input end and the output end of each logic circuit is short-circuited by the short circuit means, an output signal from any one of a plurality of signal input circuits is outputted intact through each short circuit means and the OR gate by making each switch to be on-state. A threshold of each signal input circuit is judged on the bases of a value of signal outputted from the OR gate and voltage of signal inputted to any on of the signal input circuits.

According to the third invention of the test circuit for the signal input circuit having a threshold, since a portion between the input end and the output end of the logic circuit is short circuited by the short circuit means, an output signal from any one of a plurality of the signal input circuits is outputted intact through the OR gate and the short circuit means by making a switch to be on state. A threshold of each signal input circuit is judged on the bases of a value of signal outputted from the short circuit means and voltage of signal inputted to any one of the signal input circuits.

The above and further objects and features of the invention will more fully be apparent from the following detailed description with accompanying drawings.

DESCRIPTION OF THE PREFERRED EMBODIMENTS

In the following explanation will be made in detail referring to drawings showing embodiments of the invention.

Figure 2:
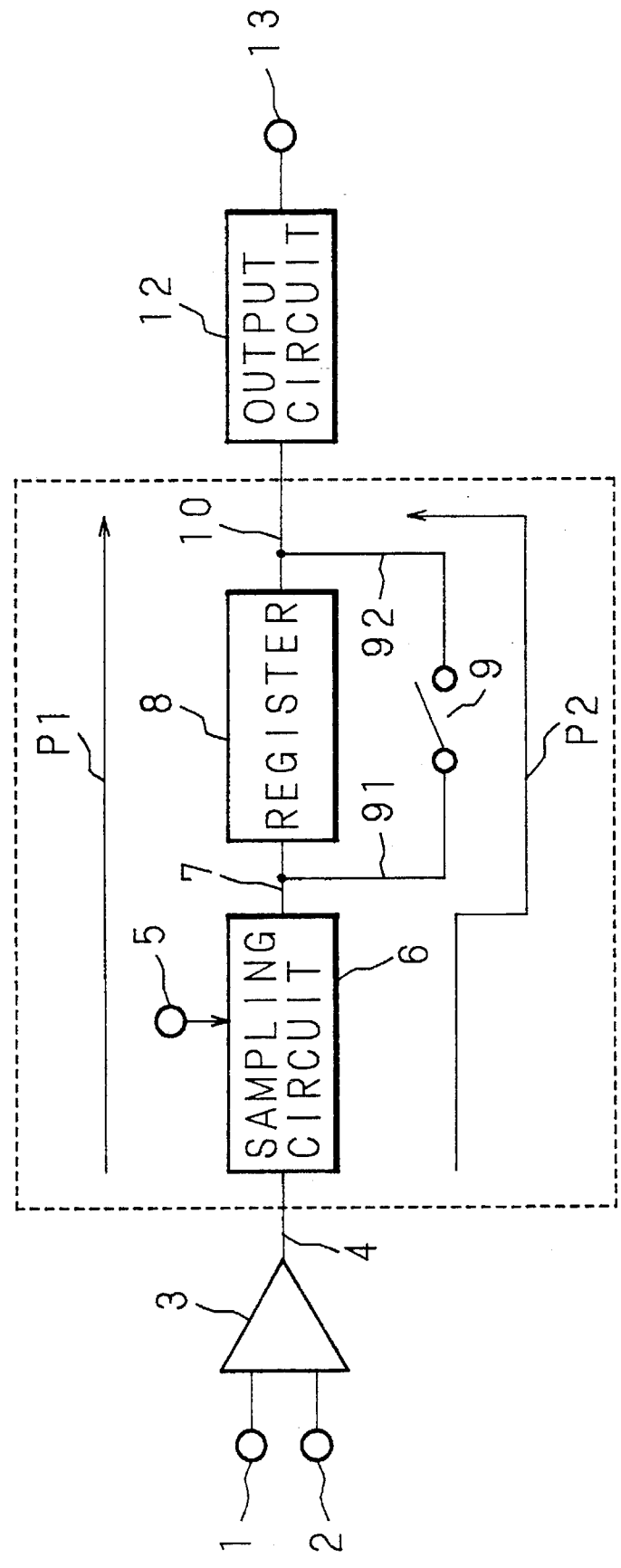
FIG. 2 is a block diagram showing an outline of a configuration example of a first embodiment of a test circuit for a signal input circuit having a threshold of the invention.

FIG. 2 is a block diagram showing an outline of a configuration example of the first embodiment of the invention (hereinafter, to be called a first embodiment) for a signal input circuit having a threshold of the invention (hereinafter, to be called a test circuit of the invention). In this first embodiment, a circuit, testing a threshold of an operational amplifier to which an analog signal is inputted as a signal input circuit having a threshold (hereinafter, to be called an input threshold circuit), as an example, is shown.

Figure 1:
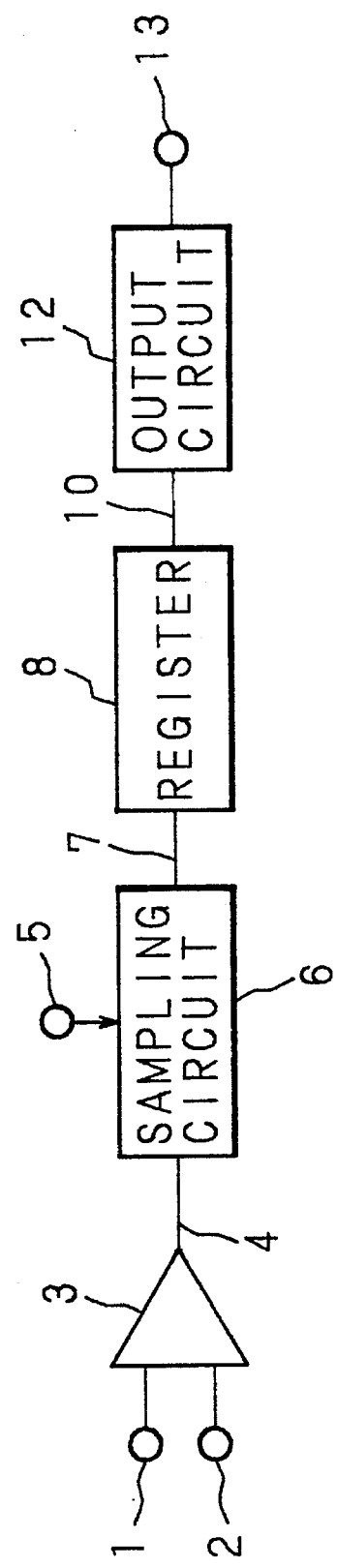
FIG. 1 is a block diagram showing a configuration example of a conventional test circuit for a signal input circuit having threshold.

In FIG. 2, reference numeral 1 designates an analog input terminal, 2 designates a reference voltage input terminal for setting a threshold, 3 designates a signal input circuit having a threshold, that is, an operational amplifier as an input threshold circuit, 4 designates an operational amplifier output signal, 6 designates a sampling clock, 6 designates a sampling circuit, 7 designates an output signal (hereinafter, to be called a sampling output) of the sampling circuit 6, 8 designates a register as a logic circuit, 10 designates an output dedicated line, 12 designates an output circuit, and 13 designates a judging terminal. The above configuration is same as the conventional one shown in FIG. 1 mentioned before.

Reference numeral 9 designates a direct output switch, one end thereof being connected to the input end of the register 8 through the signal line 91 being as short circuit means, and the other end being connected to the output end of the register 8 through the signal line 92 being as short-circuiting means, respectively. The area enclosed in dashed lines in FIG. 2 shows an area configured by the sampling circuit 6 and the register 8, including the direct output switch 9 above-mentioned, the area being called a direct output built-in circuit in the following explanation.

Operation of the first embodiment in the test circuit of the invention of such a configuration is as follows.

In the test circuit of the invention shown in FIG. 2, a certain constant voltage, 1 V as a threshold, for example, is inputted to the reference voltage input terminal 2, and voltage more than the reference voltage, 1.5 V, for example, is inputted to the analog input terminal 1. Thereby, the operational amplifier 3 operates responsive to the voltages of the input signals from the two input terminals, and output "1" as the output signal 4.

On the contrary, voltage less than reference voltage, 0.5 V, for example, is inputted to the analog input terminal 1, the operational amplifier 3 outputs "0" as the output signal 4.

By the fact that the sampling circuit 6 takes in the output signal 4 of the operational amplifier 3 in synchronism with the sampling clock 5, the sampling output 7 is obtained. The sampling clock is supplied from the exterior in the same way as the conventional example, or the internal system clock or the frequency dividing clock thereof is used as the sampling clock.

The sampling output 7 from the sampling circuit 6 is, as shown as a first path P1 in FIG. 2, usually inputted to the register 8 with software processing and temporarily held therein, then outputted to the output dedicated line 10 with software processing and outputted to the judging terminal 13 from the output circuit 12.

But the operation above-mentioned is a usual general operation in which a signal is inputted to the logical circuit and processed therein. Separately from the usual operation, as shown as the second path P2 in FIG. 2, when the sampling circuit 6 and the output circuit 12 is directly connected by making the direct output switch 9 on mechanically, in other words, the input end and the output end of the register 8 is short-circuited, the sampling output 7 from the sampling circuit 6 is outputted intact to the output circuit 12.

In such a way, since the sampling output 7 directly outputted from the sampling circuit 6 to the output circuit 12 is outputted to the judging terminal 13, by reading out the value, that is "1" or "0", voltage of analog signal inputted to analog input terminal 1 of the operational amplifier 3 is changed step by step and an actual threshold of the operational amplifier 3 becomes clear.

According to the above-mentioned, the judging of a threshold of the operational amplifier 3 as the input threshold circuit can be performed at high speed with no software processing.

Next, explanation will be given on the other embodiment of the first invention of the test circuit of the invention (hereinafter, to be called the second embodiment) will be given.

Figure 3:
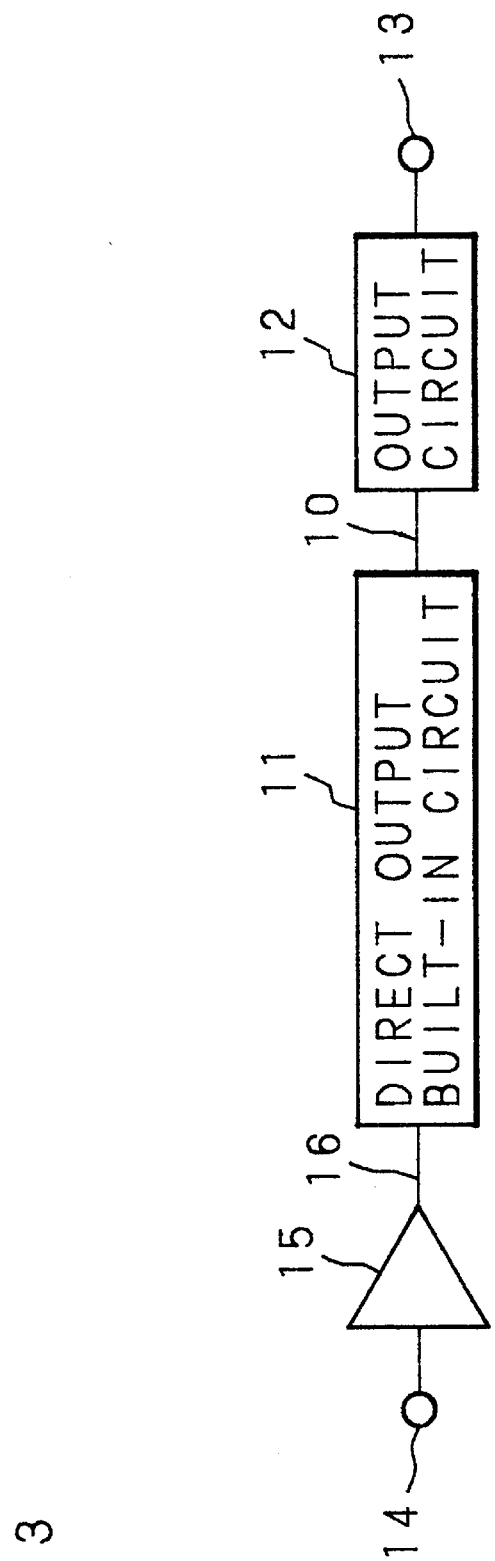
FIG. 3 is a block diagram showing an outline of a configuration example of a second embodiment of a test circuit for a signal input circuit having a threshold of the invention.

FIG. 3 is a block diagram showing a configuration example of an outline of the second embodiment of a test circuit of the invention. In addition, in the second embodiment, a circuit, testing a threshold of a CMOS buffer to which a digital signal is inputted as an input threshold circuit, is shown.

In FIG. 3, reference numerals 10 to 13 designate the same one as in the first embodiment. Therefore, an explanation thereof will be omitted.

Reference numeral 14 designates a digital input terminal, 15 designates a CMOS buffer as a logic circuit, connected to the digital input terminal 14, 16 designates an output of the CMOS buffer 15 (hereinafter, to be called CMOS buffer output).

The operation of the second embodiment of the test circuit of the invention of such a configuration is as follows.

In FIG. 3, when a threshold of the CMOS buffer 15, that is, voltage of more than 0.5×Vcc (source voltage) is inputted to the digital input terminal 14, "1" as the CMOS buffer output 16 is outputted, and when voltage less than the threshold is inputted, "0" as the CMOS buffer output 16 is outputted. Operations to be followed from the direct output built-in circuit 11 to the judging terminal 13 is the same as in the first embodiment.

Next, explanation will be given on one embodiment of the second invention (hereinafter to be called a third embodiment) of the test circuit of the invention.

Figure 4:
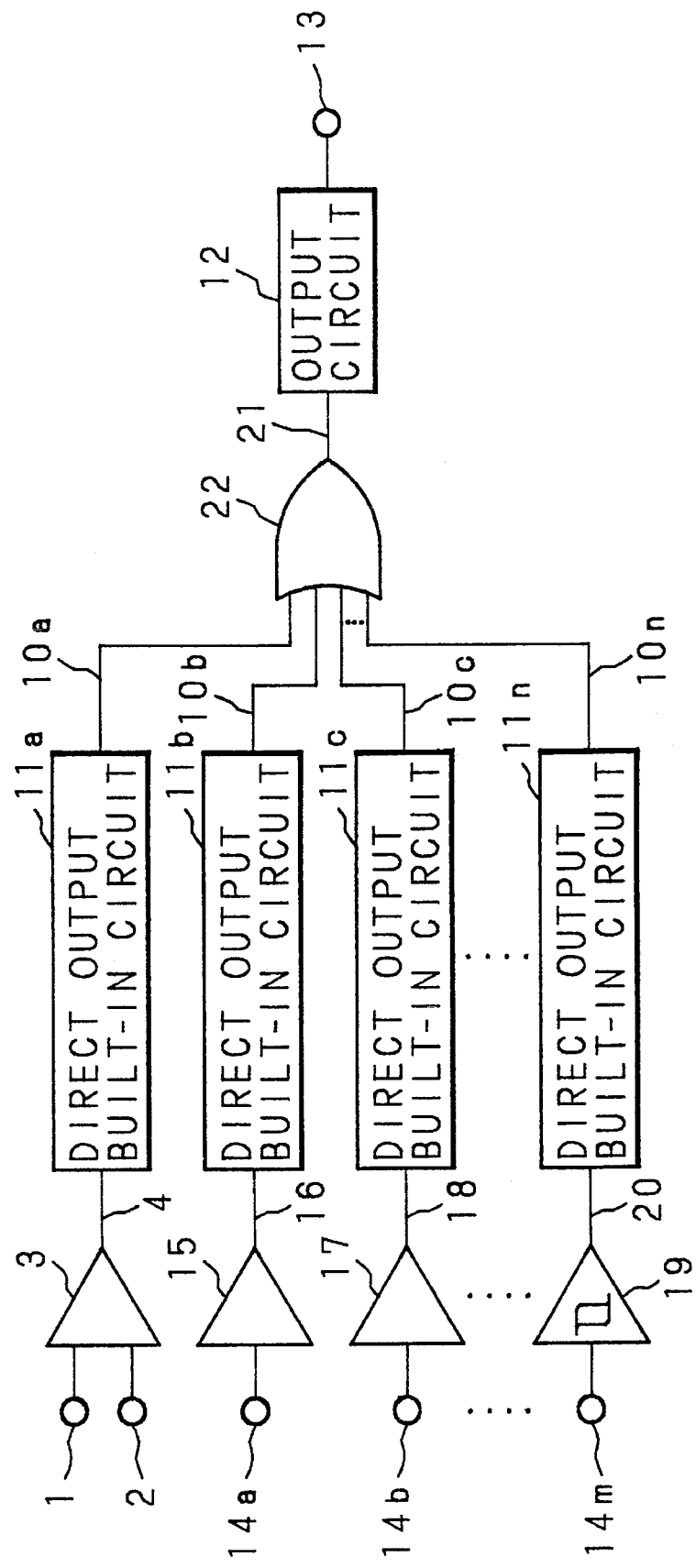
FIG. 4 is a block diagram showing an outline of a configuration example of a third embodiment of a test circuit for a signal input circuit having a threshold of the invention.

FIG. 4 is a block diagram showing a configuration example of the third embodiment of a test circuit of the invention. The present invention lies at the root of the configurations of the first an second embodiments shown in the aforementioned FIG. 2 and FIG. 3, however, explanation will be given on a circuit for testing a plurality of the input threshold circuits in the following embodiments. The object thereof is to provide a test circuit capable of carrying out a test of a plurality of input threshold circuits which input signals to a plurality of logic circuits in an integrated circuit configured on one chip, and whose thresholds and characteristics are different from each other, without making the occupied area of the test circuit on the chip large.

In addition, in the third embodiment, a configuration of an outline of the test circuit which is so configured that a test of a plurality of the input threshold circuits can be performed by one judging terminal, for example, is shown.

In FIG. 4, since reference numerals 1 to 4 and 10 to 16 designate the same ones in the first and second embodiments shown in FIG. 2 and FIG. 3, the explanation thereof will be omitted. Numeral 11 designates a direct output built-in circuit, and in the embodiment, n number of the direct output built-in circuits of reference symbols 11a to 11n are provided. Accordingly, there are also n number of the output dedicated lines of symbols 11a to 11n. Numeral 14 designates a digital input terminal, and in this embodiment, m number of the terminals of symbols 14a to 14m are provided.

Reference numeral 14 designates a TTL buffer connected to a digital input terminal 14b, 18 designates an output of the TTL buffer 17 (hereinafter, to be called TTL buffer output), 19 designates a Schmitt buffer connected to the digital input terminal 14m, and 20 designates an output of the Schmitt buffer 19 (hereinafter, to be called Schmitt buffer output). Accordingly, there are n number of the input threshold circuits including the operational amplifier 3, CMOS buffer 15, TTL buffer 17, and Schmitt buffer 19, and the direct output built-in circuits 11a to 11n are respectively connected.

Moreover, reference numeral 22 designates an OR gate which makes the outputs from n number of the output dedicated lined 10a to 10n as inputs, and 21 designates an output signal line (hereinafter, to be called output common dedicated line) of the OR gate 22. In the embodiment, output of the output common dedicated lined 21 which is an output signal line of the OR gate is inputted to the output circuit 12.

Explanation will be given on the operation of the third embodiment of such a test circuit of the invention.

In FIG. 4, the operation in which analog signal is inputted to the analog input terminal 1, and the output signal 4 of the operational amplifier 3 is outputted to the output dedicated line 10a, and the operation in which a digital signal is inputted to the digital input terminal 14a and the CMOS buffer output 16 is outputted to the output line 10b are same as in the aforesaid first embodiment and second embodiment.

When voltage more than "H" level threshold (2 V) of the TTL buffer 17 is inputted to the digital input terminal 14b, "1" as the TTL buffer output 18 is outputted, and when voltage less than "L" level threshold (0.8 V) is inputted, "0" as the TTL buffer output 18 is outputted. When voltage more than "H" level threshold (0.7×Vcc) of the Schmitt buffer 19 is inputted to the digital input terminal 14m, "1" is outputted to the Schmitt buffer output 20, and when voltage less than "L" level threshold (0.3×Vcc) is inputted, "0" is outputted to the Schmitt buffer output 20.

The outputs of the respective input threshold circuits, the operational amplifier output 4, CMOS buffer output 16, TTL buffer output 18, Schmitt buffer output 20 are connected respectively to the output dedicated lines 10a to 10m through the direct output built-in circuits 11a to 11n having the same configuration as the direct output built-in circuit 11a shown in FIG. 2. And all of the output signals to these output dedicated lines 10a to 10n are inputted to the OR gate 22 to obtain a logical sum, and the OR signal of the result is outputted to the output common dedicated line 21 and is so connected as to be outputted to the judging terminal 13 through the output circuit 12.

In performing a test in the third embodiment of the test circuit of the invention, the respective direct output switches 9 of the direct output built-in circuits 11a to 11n are turned on, and only one of the output signals 4, 16, 18, 20 and the like of the respective input threshold circuits 3, 15, 17, 19 and the like is input to one of the corresponding direct output built-in circuits 11a to 11n, and to the remaining direct output built-in circuits 11a to 11n, a "L" level is input. Thereby, since a test for only one input threshold circuit can be done, it becomes possible to perform testing of a number of input threshold circuits by one judging element.

Next, explanation will be given on one embodiment of the third invention (hereinafter, to be called a fourth embodiment) of the test circuit of the invention.

Figure 5:
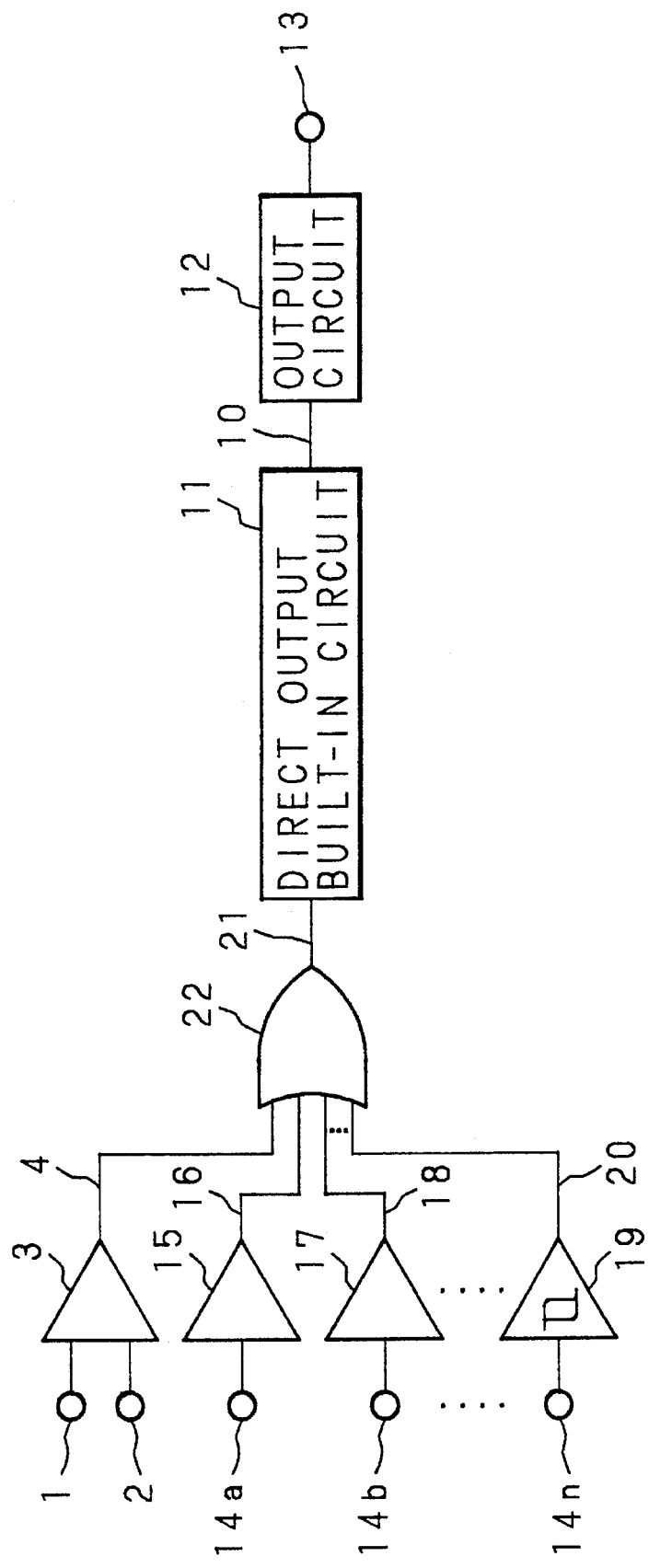
FIG. 5 is a block diagram showing an outline of a configuration example of a fourth embodiment of a test circuit for a signal input circuit having a threshold of the invention.

FIG. 5 is a block diagram showing an outline of a configuration example of the fourth embodiment of a test circuit of the invention. In the embodiment, a test circuit which is so configured that a plurality of input threshold circuits can be measured by one judging terminal, for example, is shown.

In FIG. 5, respective reference numerals designate the same ones as those in the aforementioned third embodiment shown in FIG. 4, explanation will be omitted.

In addition, the difference between the fourth embodiment and the third embodiment shown in the above-mentioned FIG. 4 is that, in the fourth embodiment, only one direct output built-in circuit 11 is provided, and the embodiment is so configured that the n number of the output signals of the input threshold circuits, such as the operational amplifier output, 4, CMOS buffer output 16, TTL buffer output 18, Schmitt buffer output 20, and the like are inputted to the OR gate 22, and the output signal therefrom is inputted to the direct output built-in circuit 11 through the output common dedicated line 22.

Explanation will be made on the operation of the fourth embodiment of the test circuit of the invention.

In FIG. 5, the operation until signals are outputted to the operational amplifier output 4, CMOS buffer output 16, TTL buffer output 18, Schmitt buffer output 20 respectively is same as in the above-mentioned third embodiment.

The operational amplifier output 4, CMOS buffer output 16, TTL buffer output 18, and Schmitt buffer output 20 are inputted to the OR gate 22 to obtain logical sum, and the OR signal outputted to the output common dedicated line 21 is inputted to the direct output built-in circuit 11. At this time, the direct output switch 9 of the direct output built-in circuit 11 is turned on, and only one of the input threshold circuits 3, 15, 17, 19 and the like are operated so that only one of the output signals 4, 16, 18, 20 and the like is inputted to the OR gate 22, and the remaining signals are inputted in "L" level. Thereby, since a test for only one input threshold circuit can be performed, it becomes possible to perform testing of a number of input threshold circuits by one judging terminal 13.

Next, explanation will be given on a fifth embodiment of the test circuit of the invention.

Figure 6:
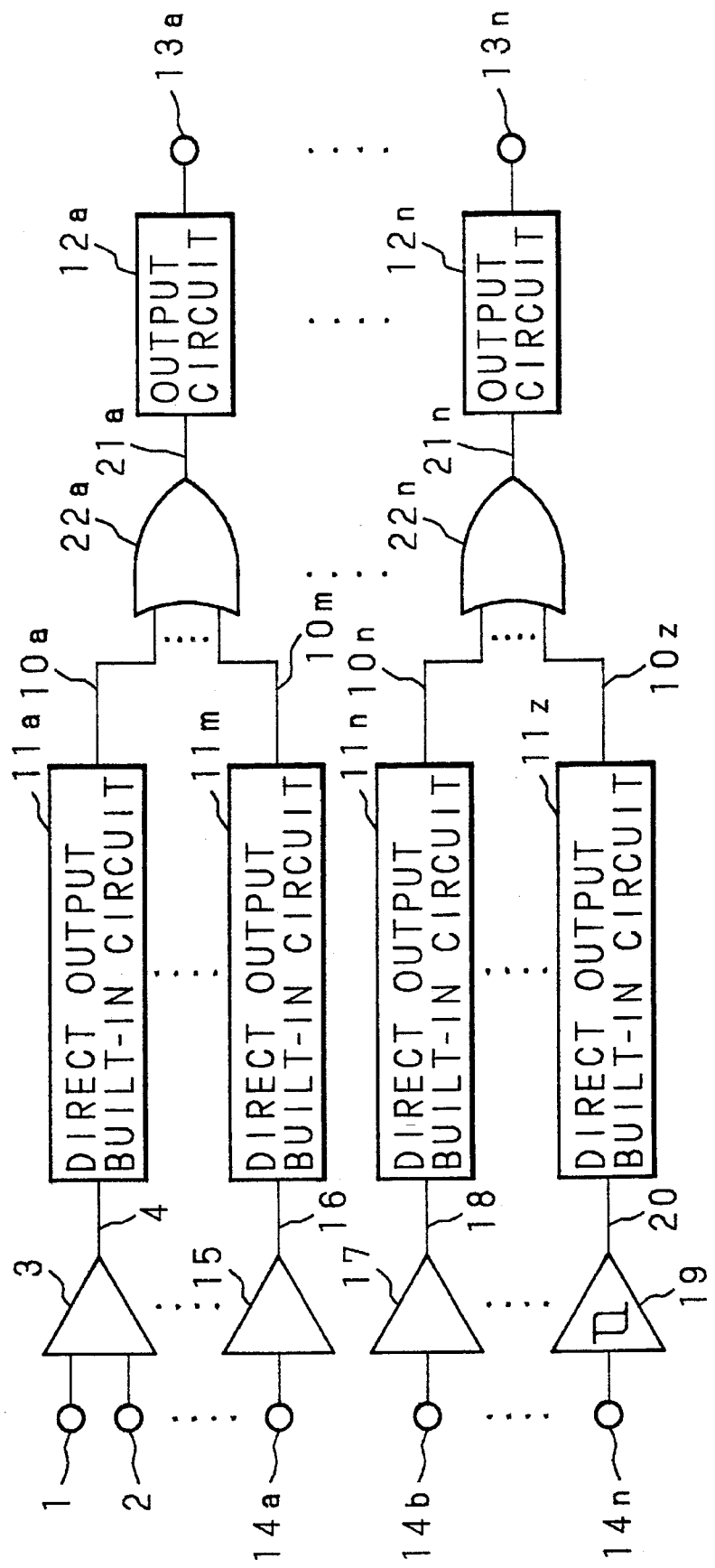
FIG. 6 is a block diagram showing an outline of a configuration example of a fifth embodiment of a test circuit for a signal input circuit having a threshold of the invention.

FIG. 6 is a block diagram showing a configuration of an outline of the fifth embodiment of the invention, in which a test circuit capable of determining a plurality of input threshold circuits by a plurality of judging terminals, for example, is shown.

In FIG. 6, respective reference numerals designate the same ones as those in the third embodiment shown in FIG. 4. But in the fifth embodiment, such a configuration is obtained by arranging a plurality of configuration of the third embodiment shown in FIG. 4 in parallel. To be concrete, to a plurality of OR gates 22a to 22n, output signals 10a to 10m and 10n to 10z of a plurality of the direct output built-in circuits 11a to 11m and 11n to 11z are inputted, and the output signals of the respective OR gates 22a to 22n are outputted from the output common dedicated lined 21a to 21n to the corresponding judging terminals 13a to 13n through the output circuits 12a to 12n.

To the respective output built-in circuits 11a to 11m and 11n to 11z, a plurality of input threshold circuits such as the operational amplifier 3, CMOS buffer 15, TTL buffer 17, Schmitt buffer 19 and the like are connected optionally.

Next, explanation will be given on the operation of the fifth embodiment.

In FIG. 6, the operation until signals are outputted to the output dedicated lines 10a to 10m and 10n to 10n and the like is same as that in the third embodiment.

The outputs of the output dedicated lines 10a to 10m and 10n to 10z and the like are respectively inputted to the OR gates 22a to 22n to obtain logical OR, and the outputs of the output dedicated lines 21a to 21n being the outputs therefrom are independently inputted to the output circuits 12a to 12n, then outputted to a plurality of the judging terminals 13a to 13n.

According to a configuration of the fifth embodiment, by grouping the input threshold circuits having different thresholds from each other or a plurality of the input threshold circuits, a test for the input threshold circuits in each group can be done by using a plurality of judging terminals 13a to 13n respectively.

Next, explanation will be given on a sixth embodiment of the test circuit of the invention.

Figure 7:
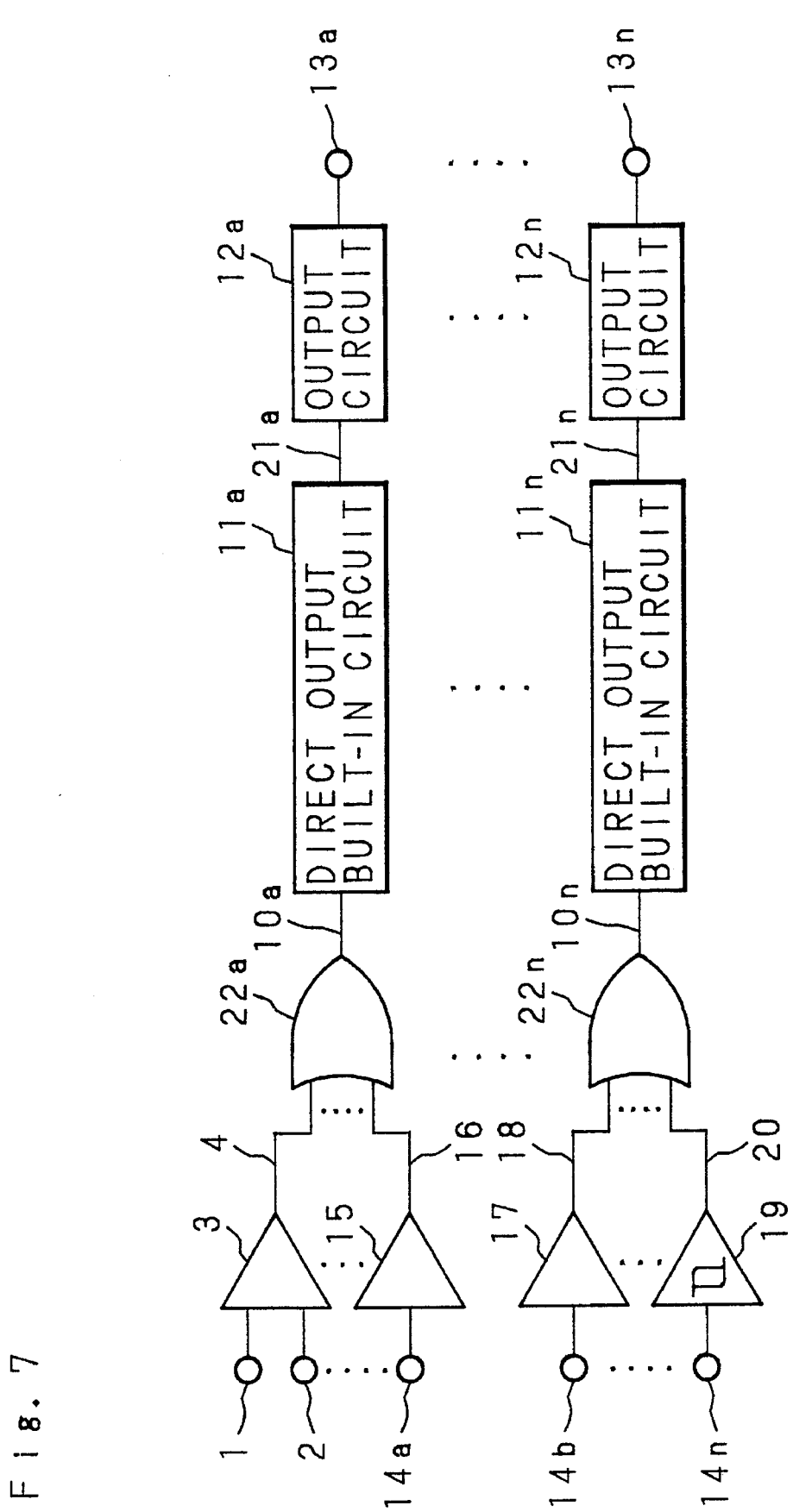
FIG. 7 is a block diagram showing an outline of a configuration example of a sixth embodiment of a test circuit for a signal input circuit having a threshold of the invention.

FIG. 7 is a block diagram showing a configuration of an outline of the sixth embodiment of the test circuit of the invention, in which a test circuit capable of measuring a plurality of the input threshold circuits by a plurality of the judging terminals, for example, is shown.

In FIG. 7, respective reference numerals designate the same ones as those in the fourth embodiment shown in FIG. 5. But in the sixth embodiment, such a configuration is obtained by arranging a plurality of the configurations of the fourth embodiment shown in FIG. 5 in parallel. To be concrete, to a plurality of the respective OR gates 22a to 22n, a plurality of the input threshold circuits such as the operational amplifier 3, CMOS buffer 15, TTL buffer 17, Schmitt buffer 19 and so on are optionally connected. The output signals of the respective OR gates 22a to 22n are outputted to the direct output built-in circuits 11a to 11n through the output dedicated lines 10a to 10n respectively and furthermore are outputted from the output circuits 12a to 12n through the output common dedicated lines 21a to 21n to the respectively corresponding judging terminals 13a to 13n.

Next, explanation will be given on the operation of the sixth embodiment of the test circuit of the invention.

In FIG. 7, the operation until the operational amplifier output 4, CMOS buffer output 16, TTL buffer output 18, Schmitt buffer output 20, and the like are outputted from the input threshold circuits such as the operational amplifier 3, CMOS buffer 15, TTL buffer 17, and Schmitt buffer 19, is same as that in the third embodiment.

The outputs of the input threshold circuits such as the operational amplifier output 4, CMOS buffer output 16, TTL buffer output 18, Schmitt buffer output 20 are logical summed plural at a time by the OR gates 22a to 22n. The respective outputs of the output dedicated lines 10a to 10n are inputted to the output circuits 12a to 12n through the independently corresponding direct output built-in circuits 11a to 11n, and outputted respectively to a plurality of the judging terminals 13a to 13n. Thereby, it becomes possible to test the input, threshold circuits connected to the respective OR gates 22a to 22n at every group by grouping the circuits each having a different threshold or a plurality of the circuits.

In addition, in all of the first to sixth embodiments mentioned above, though a register 8 is applied as a logic circuit, it is not limited to this. The present invention can be applied even to the case where logic circuits such as a microcomputer and the like are used.

In addition, in the aforementioned first to sixth embodiments, though explanation was given on the sampling clock 6 in the case where one external clock, internal clock or the frequency dividing clock thereof is used, the same effect will be obtained as that in the aforesaid embodiments when D flip flop, for example, is used for the sampling circuit, it being also preferable to use different sampling clocks in the front position and the rear position thereof.

In the aforesaid first to sixth embodiments, though explanation was given on the case where the direct output switch 9 is made on/off mechanically, the same effect will be obtained as that in the aforementioned embodiment, when the direct output switch 9 is switched by the external trigger or by the register.

Moreover, in the aforesaid first to sixth embodiments, though explanation was given on the case where independent dedicated lines such as the output dedicated line 10 (10a to 10n) and the output common dedicated lines 21a to 21n, are connected to the input threshold circuits, the same effect as that in the aforesaid embodiment will be obtained when a signal line such as a bus is used.

Furthermore, in the aforesaid first to sixth embodiments, though explanation will be made on the case where the sampling circuit 6 is used, the same effect will be obtained when a latch or the like which does not need a clock is used.

As described before, according to the present invention, since it becomes possible to take out a signal value outputted from the signal input circuit having a threshold to the outside directly without software processing, it becomes possible to perform testing of the signal input circuit at high speed, and it becomes also possible to perform testing in high accuracy even in the case where a logic circuit of low voltage specification which is recently popular, is used.

In the second and third inventions, since it is possible to take out one output signal by grouping a plurality of the signal input circuits, it becomes possible to make the occupied area of the test circuit small on a chip even in an integrated circuit in which various kinds of logic circuits are formed on one chip.

As this invention may be embodied in several forms without departing from the spirit of essential characteristics thereof, the present embodiment is therefore illustrative and not restrictive, since the scope of the invention is defined by the appended claims rather than by the description preceding them, and all changes that fall within the metes and bounds of the claims, or equivalence of such metes and bounds thereof are therefore intended to be embraced by the claims.

What is claimed is:

1. A test circuit for use in testing a signal input circuit which converts an input voltage signal into a binary signal at a predetermined threshold and supplies it to a logic circuit having an input end and an output end, comprising:

short-circuiting means for short-circuiting the input end and the output end of said logic circuit together; and a switch which is interposed in said short-circuiting means;

whereby a threshold of said signal input circuit may be judged on the basis of the input voltage inputted to said signal input circuit and a value of an output signal outputted from said signal input circuit through said short-circuiting means when said switch is in an ON state.

2. A test circuit for testing a signal input circuit as set forth in claim 1, wherein said signal input circuit is an operational amplifier.

3. A test circuit for testing a signal input circuit as set forth in claim 1, wherein said signal input circuit is a CMOS buffer.

4. A test circuit for testing a signal input circuit as set forth in claim 1, wherein said signal input circuit is a TTL buffer.

5. A test circuit for testing a signal input circuit as set forth in claim 1, wherein said signal input circuit is a Schmitt buffer.

6. A test circuit for use in testing a plurality of signal input circuits, each of which converts an input voltage signal into a binary signal at a predetermined voltage threshold and supplies it, respectively, to each of a plurality of logic circuits, each having an input end and an output end, comprising:

a plurality of short-circuiting means, each including a switch, for short-circuiting the input end and the output end of each of said logic circuits together when said switch is in an ON state; and an OR gate having an input end connected to output ends of said plurality of logic circuits and an output end for providing an output;

whereby a voltage threshold of each of said signal input circuits may be judged on the basis of an input voltage signal inputted to each of said signal input circuits and a value of an output signal outputted from any one of said plurality of signal input circuits through each of said short-circuiting means and said OR gate.

7. A test circuit obtained by arranging on one chip a plurality of test circuits, each for use in testing a plurality of signal input circuits, each of which converts an input voltage signal into a binary signal at a predetermined threshold and supplies it, respectively, to each of a plurality of logic circuits, each having an input end and an output end, each of said plurality of test circuit comprising:

a plurality of short-circuiting means, each including a switch, for short-circuiting the input end and the output end of each of said logic circuits together when said switch is in an ON state; and an OR gate having an input end connected to output ends of said plurality of logic circuits, and an output end for providing an output;

whereby a voltage threshold of each of said signal input circuits may be judged on the basis of an input voltage signal inputted to each of said signal input circuits and a value of an output signal outputted from any one of said plurality of signal input circuits through each of said short-circuiting means and said OR gate.

8. A test circuit for use in testing a plurality of signal input circuits, each of which converts an input voltage signal into a binary signal at a predetermined threshold and supplies it through an output end to a logic circuit, comprising:

short-circuiting means including a switch for short-circuiting an input end and an output end of said logic circuit together when said switch is in an ON state; and an OR gate having an input end connected to the output ends of each of said signal input circuits, and an output end connected to the input end of said logic circuit;

whereby a voltage threshold of each of said signal input circuits may be judged on the basis of an input voltage signal inputted to each of said signal input circuits and a value of an output signal outputted from any one of said plurality of signal input circuits through said OR gate and said short-circuiting means.

9. A test circuit obtained by arranging on one chip a plurality of test circuits, each for use in testing a plurality of signal input circuits, each of which converts an input voltage signal into a binary signal at a predetermined threshold and supplies it to a logic circuit, each of said plurality of test circuit comprising:

short-circuiting means including a switch, for short-circuiting an input end and an output end of said logic circuit together when said switch is in an ON state; and an OR gate having an input end connected to the output ends of each of said signal input circuits, and an output end connected to the input end of said logic circuit;

whereby a voltage threshold of each of said signal input circuits may be judged on the basis of an input voltage signal inputted to each of said signal input circuits and a value of an output signal outputted from any one of said plurality of signal input circuits through said OR gate and said short-circuiting means.

10. A method to be employed in conjunction with a test circuit for judging a threshold voltage level of a signal input circuit, said input circuit having an input end and an output end, and said test circuit comprising:

(a) a logic circuit having an input means and an output means;

(b) a selectively activated bypass means for bypassing at least a part of said logic circuit; and (c) an output circuit means coupled said logic circuit output means and to said bypass means for providing an output;

the method comprising the steps of:

(1) applying an input voltage signal to an input end of said signal input circuit;

(2) generating a binary signal in response to said input voltage signal exceeding the threshold voltage level of said signal input circuit;

(3) applying said binary signal to the logic circuit input means; and (4) selectively activating said bypass means for bypassing said binary signal to said output circuit means to provide said output.

\* \* \* \* \*